US008243977B2

(12) United States Patent
Dai et al.

(10) Patent No.: US 8,243,977 B2
(45) Date of Patent: Aug. 14, 2012

(54) MEDIA PLAYER SYSTEM, MEDIA PLAYER, AND EARPHONE

(75) Inventors: Lung Dai, Taipei Hsien (TW); Wang-Chang Duan, Shenzhen (CN); Bang-Sheng Zuo, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 1083 days.

(21) Appl. No.: 12/147,505

(22) Filed: Jun. 27, 2008

(65) Prior Publication Data

US 2009/0245550 A1 Oct. 1, 2009

(30) Foreign Application Priority Data

Mar. 26, 2008 (CN) .......................... 2008 1 0300726

(51) Int. Cl.
*H04R 25/00* (2006.01)
*H04R 3/00* (2006.01)
*H03G 3/20* (2006.01)

(52) U.S. Cl. ........................................ 381/384; 381/110

(58) Field of Classification Search .................. 381/109, 381/110, 384
See application file for complete search history.

(56) References Cited

U.S. PATENT DOCUMENTS

| | | | | |
|---|---|---|---|---|
| 5,200,708 | A * | 4/1993 | Morris et al. | 330/124 R |
| 5,420,739 | A | 5/1995 | Yokozawa et al. | |
| 6,980,666 | B1 * | 12/2005 | Owen | 381/371 |
| 2003/0002688 | A1 * | 1/2003 | Kanevsky et al. | 381/74 |
| 2003/0053650 | A1 * | 3/2003 | Wang | 381/384 |
| 2007/0098202 | A1 * | 5/2007 | Viranyi et al. | 381/380 |

* cited by examiner

*Primary Examiner* — Elvin G Enad
*Assistant Examiner* — Alexander Talpalatskiy
(74) *Attorney, Agent, or Firm* — Altis Law Group, Inc.

(57) ABSTRACT

An exemplary media player system includes a media player and an earphone. The earphone includes a first earpiece, a second earpiece, a primary volume control unit, and a secondary volume control unit. The first earpiece and the second earpiece are configured for receiving first channel audio signals and second channel audio signals respectively, and converting the audio signals to yield audible sounds. The primary volume control unit adjusts the volume levels of the first earpiece and the second earpiece simultaneously. The secondary volume control unit adjusts the volume of sounds outputted from one of the first earpiece and the second earpiece.

9 Claims, 3 Drawing Sheets

MEDIA PLAYER SYSTEM, MEDIA PLAYER, AND EARPHONE

BACKGROUND

1. Field of the Invention

The present invention generally relates to media player systems, and particularly to a media player system including a media player and an earphone.

2. Description of Related Art

Earphones are widely used in audio reproducing devices, such as compact disc (CD) players, and moving picture experts group audio layer III (MP3) players. The earphone generally includes a pair of earpieces. The earphone is operatively coupled to an audio reproducing device for receiving audio signals transmitted from the audio reproducing device. The audio signals are received and converted to yield audible sounds by the pair of earpieces.

Typically, the earphone is provided with a volume control unit for adjusting volume level of the sounds outputted from the pair of earpieces.

However, the earphone with only one volume control unit has a limitation. It does not provide an option for persons with hearing impairment in one ear to set the volume levels of the corresponding earpiece independently. Thus, persons wearing the earphone may not be able to obtain good audio balance.

Therefore, providing an earphone capable of independently adjusting volume levels of at least one earpiece is desired.

SUMMARY

Accordingly, an earphone capable of independently adjusting volume levels of at least one earpiece is provided. The earphone includes a first earpiece, a second earpiece, a primary volume control unit, and a secondary volume control unit. The first earpiece and the second earpiece are configured for receiving first channel audio signals and second channel audio signals respectively delivered from a media player, and converting the audio signals to yield audible sounds. The primary volume control unit is configured for simultaneously adjusting the volume levels of the first earpiece and the second earpiece. The secondary volume control unit is configured for selectively adjusting the volume levels of sounds outputted from one of the first earpiece and the second earpiece.

Other advantages and novel features will become more apparent from the following detailed description of exemplary embodiment when taken in conjunction with the accompanying drawings.

DETAILED DESCRIPTION

Figure 1:
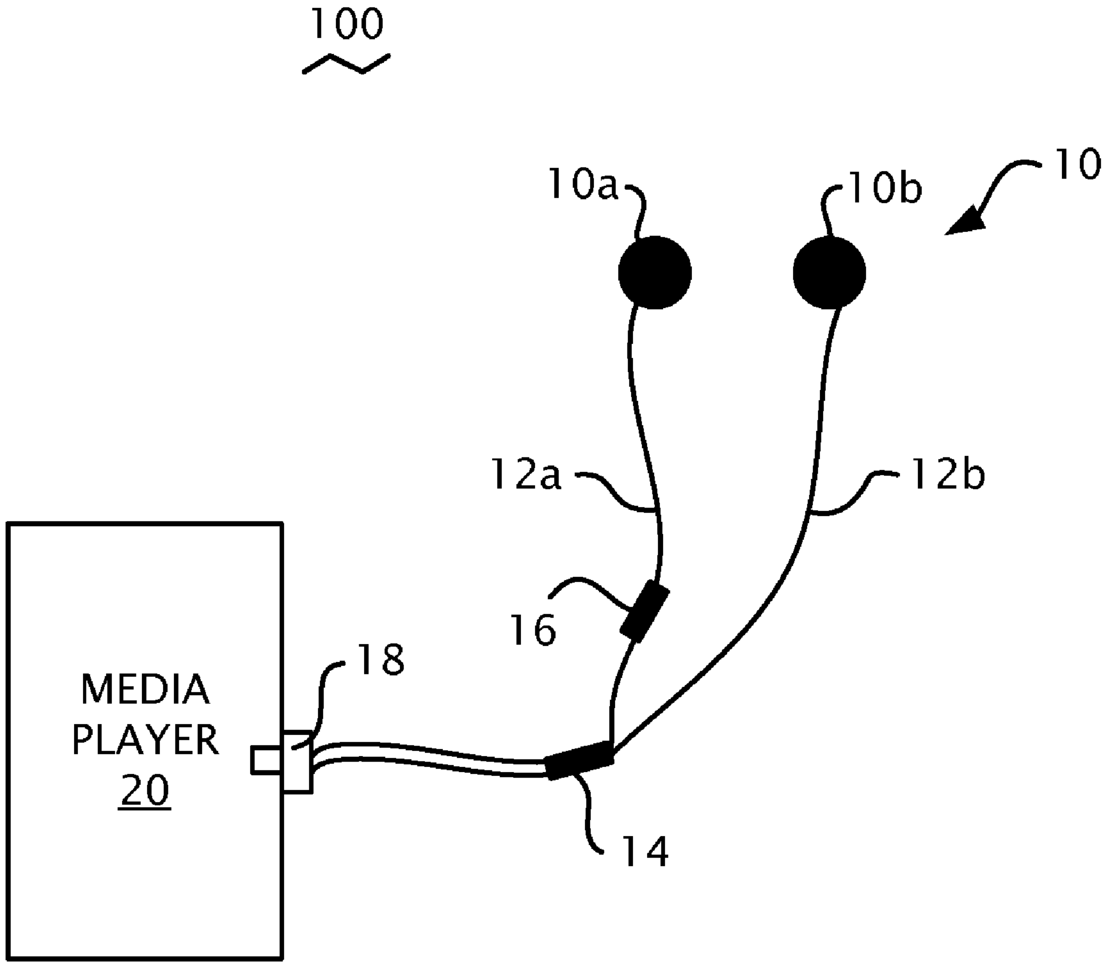
FIG. 1 is a schematic view illustrating a general configuration of a media player system including a media player and an earphone according to an exemplary embodiment.

Referring to FIG. 1, a schematic view of a media player system 100 in accordance with an exemplary embodiment is illustrated. The media player system 100 includes an earphone 10 and a media player 20 that are electrically coupled with each other. In the exemplary embodiment, the media player 20 is a moving picture experts group audio layer III (MP3) player. The media player 20 is capable of decoding audio files into audio signals, and outputting the audio signals to the earphone 10. The audio files may be stored in the media player 20 or transmitted from external devices. The earphone 10 outputs audible sounds according to the audio signals.

Hereinafter, a detail configuration of the earphone 10 will be described.

The earphone 10 includes a first earpiece 10*a*, a second earpiece 10*b*, a first audio wire 12*a*, a second audio wire 12*b*, a primary volume control unit 14, a secondary volume control unit 16, and a plug 18. The first earpiece 10*a* and the second earpiece 10*b* are electrically connected to an end of the first audio wire 12*a* and an end of the second audio wire 12*b* respectively. The other end of the first audio wire 12*a* and the second audio wire 12*b* are electrically connected to the plug 18.

The plug 18 is capable of being inserted into the media player 20 for receiving first channel audio signals and second channel audio signals outputted from the media player 20. The first channel audio signals are transmitted to the first earpiece 10*a* via the first audio wire 12*a*. The second channel audio signals are transmitted to the second earpiece 10*b* via the second audio wire 12*b*.

The primary volume control unit 14 is electrically connected in-between the first audio wire 12*a* for controlling signals transmitted on the first audio wire 12*a*. The primary volume control unit 14 is also electrically connected in-between the second audio wire 12*b* for controlling signals transmitted on the second audio wire 12*b*. In particular, the primary volume control unit 14 includes certain circuitry arranged therein for adjusting current and/or voltage magnitude of the two channel audio signals. As such, the volume levels of the sounds outputted from the first earpiece 10*a* and the second earpiece 10*b* can be increased or decreased simultaneously.

The secondary volume control unit 16 is also connected in-between the first audio wire 12*a* for controlling signals transmitted on the first audio wire 12*a*. Specifically, the secondary volume control unit 16 is electrically connected between the primary volume control unit 14 and the first earpiece 10*a*. The secondary volume control unit 16 also has certain circuitry arranged therein for adjusting current and/or voltage magnitude of the first channel audio signals. As such, the volume levels of the sounds outputted from the first earpiece 10*a* can be increased or decreased independently.

Hereinafter, a detail configuration of the media player 20 will be described.

Figure 2:
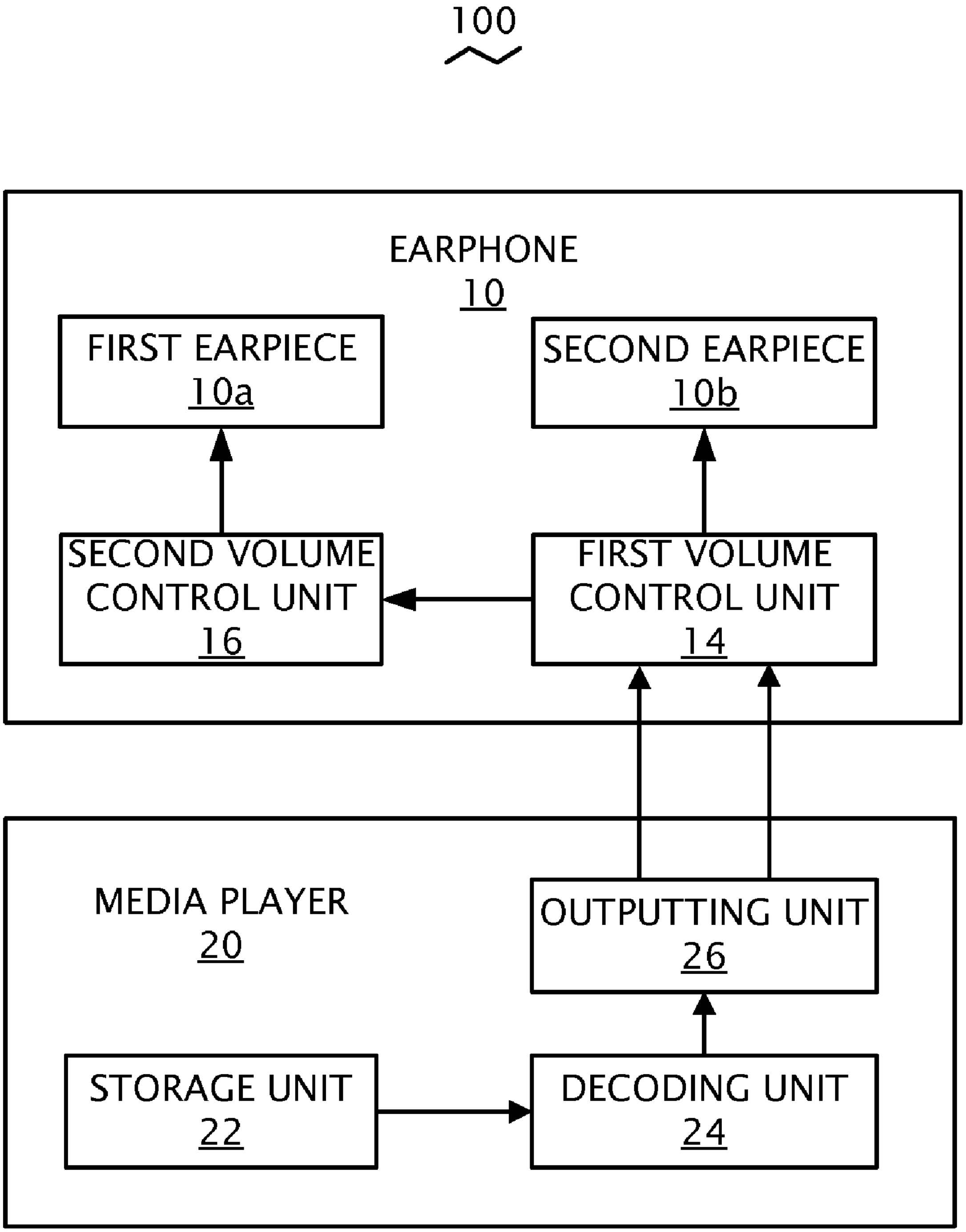
FIG. 2 is a functional block diagram of the media player system of FIG. 1.

Referring to FIG. 2, the media player 20 generally includes a storage unit 22, a decoding unit 24, and an outputting unit 26 that are coupled in series.

The storage unit 22 is configured for storing audio files readable by the decoding unit 24. The decoding unit 24 is configured for decoding the audio files read from the storage unit 22, and yielding first channel audio signals and second channel audio signals. The outputting unit 26 is configured for sending the first channel audio signals and the second channel audio signals to the earphone 10.

Hereinafter, an operation of the media player system 100 including the media player 20 and the earphone 10 will be described.

Firstly, the media player 20 may be enabled to decode the audio files stored therein, and output the first channel audio signals and the second channel audio signals. Then, the first channel audio signals and the second channel audio signals are sent to the first earpiece 10*a* and the second earpiece 10*b* via the first audio wire 12*a* and the second audio wire 12*b* correspondingly. After that, the first channel audio signals and the second channel audio signals are converted to yield audible sounds by the first earpiece 10*a* and the second earpiece 10*b* correspondingly.

In a first condition, the volume levels of the sounds outputted from the first earpiece 10*a* and the second earpiece 10*b* may be too low or two high. In the first condition, the primary volume control unit 14 may be actuated to adjust the current and/or voltage magnitude of the first channel audio signals and the second channel audio signals correspondingly, such that the volume levels of the sounds outputted from the first earpiece 10*a* and the second earpiece 10*b* are correspondingly increased or decreased simultaneously.

In a second condition, the person wearing the earphone 10 may have different hearing conditions between the left ear and the right ear. When the first earpiece 10*a* and the second earpiece 10*b* are plugged into the left ear and the right ear respectively, the volume levels of the sounds outputted to the left ear may be too low for the person to listen to. In the second condition, the secondary volume control unit 16 is actuated to adjust the current and/or voltage magnitude of the first channel audio signals, such that volume levels of the sounds outputted from the first earpiece 10*a* can be increased without affecting the volume levels of sounds outputted from the second earpiece 10*b*. Therefore, the person wearing the earphone 10 may hear a more balanced sound effect.

Figure 3:
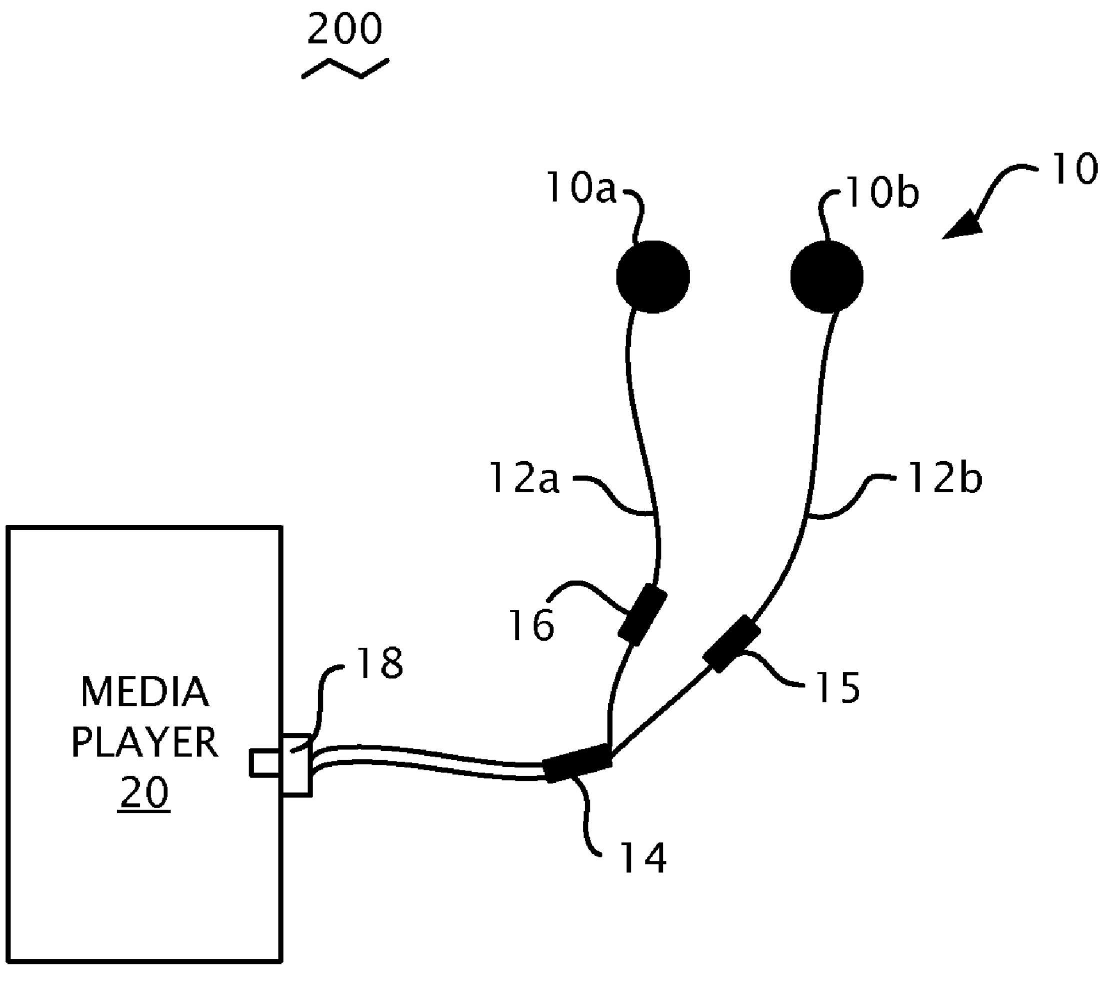
FIG. 3 is a schematic view illustrating a general configuration of a media player system including a media player and an earphone according to another exemplary embodiment.

Referring to FIG. 3, an alternative embodiment of a media player system 200 is illustrated. The media player system 200 has similar configuration to the media player system 100, e.g., including an earphone 10 and a media player 20. However, the earphone 10 of the media player system 200 further includes a tertiary volume control unit 15. The tertiary volume control unit 15 is electrically connected between the primary volume control unit 14 and the second earpiece 10*b*.

In this condition, the first earpiece 10*a* and the second earpiece 10*b* can be used by two different persons. The two different persons would have different volume preferences. Then, one of the two persons wearing the first earpiece 10*a* may use the secondary volume control unit 16 to adjust the volume levels of sounds outputted from the first earpiece 10*a* independently. Another user wearing the second earpiece 10*b* may use the tertiary volume control unit 15 to adjust the volume levels of sounds outputted from the second earpiece 10*b* independently. Therefore, the two different persons can adjust volume levels of the sounds outputted from the two earpieces independently.

As described above, the earphone 10 can be configured to operate in two different modes. In a first mode, the volume levels of the sounds outputted from the two earpieces 10*a*, 10*b* are changed simultaneously by the primary volume control unit 14. In a second mode, the volume levels of sounds outputted from one of the two earpieces 10*a*, 10*b* are changed independently by the secondary volume control unit 16.

Alternative embodiments will become apparent to those skilled in the art to which the present invention pertains without departing from its spirit and scope.

For example, the secondary volume control unit 16 can be connected in-between the second audio wire 12*b*. That is, the secondary volume control unit 16 is electrically connected between the primary volume control unit 14 and the second earpiece 10*b*.

The media player 20 may be a mobile phone. The media player 20 may not have a storage unit 22. As such, audio files may be transferred from external devices, such as storage devices of an on-line music store. It should be noted that the media player 20 may further include other units such as a display unit and a keypad (not shown). The display unit is configured for providing a graphical user interface (GUI) having a plurality of icons that may be selected by the keypad to control overall operations of the media player 20.

The earphone 10 may be wirelessly coupled to the media player 20 via wireless communication technology such as Bluetooth®. At this point, the earphone 300 may be provided with a wireless receiver for receiving decoded audio signals outputted from the media player.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A media player system comprising:

a media player for decoding audio files and outputting first channel audio signals and second channel audio signals decoded from the audio files; and an earphone associated with the media player, comprising:

a first earpiece and a second earpiece for receiving the first channel audio signals and second channel audio signals respectively, and converting the first channel audio signals and the second channel audio signals to yield audible sounds;

a primary volume control unit electrically coupled between the media player and the first earpiece and the second earpiece, the primary volume control unit capable of altering the first channel audio signals and the second channel audio signals, such that volume levels of the audible sounds outputted from the first earpiece and the second earpiece being adjusted simultaneously; and a secondary volume control unit electrically coupled between the primary volume unit and one of the first earpiece or the second earpiece for independently adjusting the volume levels of audible sounds outputted from the first earpiece or the second earpiece.

2. The media player system of claim 1, wherein the earphone further comprising:

a first audio wire for transferring the first channel audio signals from the media player to the first earpiece; and a second audio wire for transferring the second channel audio signals from the media player to the second earpiece.

3. The media player system of claim 2, wherein the primary volume control unit is disposed on the first audio wire and the second audio wire, and electrically coupled between the media player and the first earpiece and the second earpiece.

4. The media player system of claim 3, wherein the secondary volume control unit is disposed on the first audio wire, and electrically coupled between the primary volume control unit and the first earpiece.

5. The media player system of claim 3, wherein the secondary volume control unit is disposed on the second audio wire, and electrically coupled between the primary volume control unit and the second earpiece.

6. The media player system of claim 4, wherein the earphone further comprising a tertiary volume control unit, the tertiary volume control unit is disposed on the second audio wire, and electrically coupled between the primary volume control unit and the second earpiece.

7. The media player system of claim 1, wherein the earphone is wirelessly coupled to the media player in accordance with Bluetooth® communication technology.

8. An earphone for receiving audio signals from a media player, the earphone comprising:

a first earpiece and a second earpiece for receiving first channel audio signals and second channel audio signals respectively transmitted from the media player, the first earpiece and the second earpiece capable of converting the first channel audio signals and the second channel audio signals to yield audible sounds;

a primary volume control unit associated with the earphone, the primary volume control unit disposed on the first audio wire and the second audio wire, and electrically coupled between the media player and the first earpiece and the second earpiece, the primary volume control unit capable of varying the first channel audio signals and the second channel audio signals, such that volume levels of the audible sounds outputted from the first earpiece and the second earpiece can be adjusted simultaneously; and a secondary volume control unit disposed on the first audio wire, and electrically coupled between the primary volume control unit and the first earpiece for independently adjusting the volume levels of the audible sounds outputted from the first earpiece or the second earpiece.

9. The earphone of claim 8, wherein the earphone further comprising a tertiary volume control unit, the tertiary volume control unit is disposed on the second audio wire, and electrically coupled between the primary volume control unit and the second earpiece.

* * * * *